United States Patent [19]

Bashir

[11] Patent Number: 5,780,343
[45] Date of Patent: Jul. 14, 1998

[54] METHOD OF PRODUCING HIGH QUALITY SILICON SURFACE FOR SELECTIVE EPITAXIAL GROWTH OF SILICON

[75] Inventor: Rashid Bashir, Santa Clara, Calif.

[73] Assignee: National Semiconductor Corporation, Santa Clara, Calif.

[21] Appl. No.: 575,900

[22] Filed: Dec. 20, 1995

[51] Int. Cl.$^6$ ............................................. H01L 21/336
[52] U.S. Cl. ........................... 438/269; 438/478; 438/481; 438/963; 438/974; 438/413
[58] Field of Search .......................... 438/269, 478, 438/481, 963, 974, 341, 413

[56] References Cited

U.S. PATENT DOCUMENTS

| | | | |
|---|---|---|---|
| 3,615,956 | 10/1971 | Irving et al. | 156/17 |
| 4,352,724 | 10/1982 | Sugishima et al. | 204/192 E |
| 4,749,441 | 6/1988 | Christenson et al. | 438/481 |
| 4,820,654 | 4/1989 | Lee | 438/429 |
| 4,910,165 | 3/1990 | Lee et al. | 438/413 |
| 4,923,826 | 5/1990 | Jastrzebski et al. | 438/413 |
| 4,929,566 | 5/1990 | Beitman | 438/413 |
| 5,173,151 | 12/1992 | Namose | 156/643 |
| 5,269,879 | 12/1993 | Rhoades et al. | 156/643 |

OTHER PUBLICATIONS

Endo, N. et al., *Scaled CMOS Technology Using SEG Isolation and Buried Well Process*, IEEE Transactions on Electronic Devices, No. 11, Nov. 1986, pp. 1659–1667.

Nagao, S. et al., *Application of Selective Silicon Epitaxial Growth for CMOS Technology*, IEEE Transactions on Electronic Devices, No. 11, Nov. 1986, pp. 1738–1744.

*Primary Examiner*—Trung Dang
*Attorney, Agent, or Firm*—Limbach & Limbach L.L.P.

[57] ABSTRACT

A method of producing a high quality silicon surface prior to carrying out a selective epitaxial growth of silicon process for forming an active device region on a substrate. The process flow of the present invention eliminates the need for the sacrificial oxidation layer typically used in such processes. After the etching of a seed hole through the isolation oxide layer using a reactive ion etch a short, low power $C_2F_6$ etch is performed. The present invention provides a simple and cost-effective way to eliminate reactive ion etch damage prior to SEG growth because the dry $C_2F_6$ etch can be done in the same etch reactor in which the seed hole oxide etch is performed. In addition, the re-oxidation (sacrificial oxide) step is eliminated, reducing the number of process steps.

14 Claims, 3 Drawing Sheets

METHOD OF PRODUCING HIGH QUALITY SILICON SURFACE FOR SELECTIVE EPITAXIAL GROWTH OF SILICON

TECHNICAL FIELD

The present invention relates to processes used for manufacturing semiconductor devices, and more specifically, to a method of producing a high quality silicon surface prior to carrying out a selective epitaxial growth of silicon step for forming an active device region on a substrate.

BACKGROUND OF THE INVENTION

Selective Epitaxial Growth (SEG) of silicon is a technique in which a silicon monocrystalline layer is grown on an exposed silicon substrate. The growth of the layer can occur with or without silicon nucleation on an adjacent $SiO_2$ insulator region. The SEG technique is used to produce closely spaced silicon islands isolated by $SiO_2$ regions, with the silicon islands being used to form active devices. SEG can also be used to grow poly-silicon for use in forming contacts or filling trenches.

FIGS. 1A and 1B show examples of the two basic selective epitaxy processes. In the upper drawing of both figures, a substrate 10 is shown on which is located a trench 12 having $SiO_2$ insulation regions 14 on each side. In the lower drawing of FIG. 1A, epitaxial growth 16 occurs only on the bare substrate 10 within the opening in the $SiO_2$ film used to form the isolation regions. No growth occurs on oxide regions 14. In the lower drawing of FIG. 1B, epitaxial growth 16 occurs within the opening in the $SiO_2$ film simultaneously with poly-silicon deposition 18 on the oxide surface.

SEG has been identified as a key technology for future VLSI/ULSI processes. SEG, ELO (Epitaxial Lateral Overgrowth), and CLSEG (Confined Lateral Selective Epitaxial Growth) have been used to fabricate many novel bipolar, CMOS, and BICMOS devices. As noted, these selective growth techniques can be used to grow high quality silicon for active device regions or to grow poly-silicon for applications where material quality is not as important, such as for contacts, trench fills, etc.

The selective growth techniques typically involve formation of a $SiO_2$ layer on a silicon substrate. An opening or seed hole is etched in the oxide layer, followed by deposition of silicon source material atoms. The deposited atoms react with the substrate surface, resulting in the growth of a mono-crystalline silicon layer or film on the substrate.

When high quality silicon is desired (as would be used for the formation of active devices), the characteristics, texture, and morphology of the seed hole surface (the interface between the opening and the substrate, and the sides of the opening) becomes important. This is because the purity and homogeneity of the mono-crystalline silicon grown in the seed hole is affected by the nature of the seed hole surface. In most applications of silicon SEG, the seed hole is etched through the oxide layer using a reactive ion etch (RIE). The reactive ion etch step produces residual damage to the seed hole surface due to the ion bombardment, and leaves residual polymers which inhibit silicon etching on the seed hole surface. A high surface quality needs to be restored prior to the SEG process to facilitate the growth of high quality silicon. This is conventionally achieved by growing a thin sacrificial oxide layer. The high temperature of the oxidation process eliminates the polymers formed as a result of the reactive ion etch, and also consumes the damaged silicon region. The sacrificial oxide layer is then removed using a wet etch prior to carrying out selective epitaxial growth. While effective, this technique has several disadvantages. These include additional thermal diffusion during the oxidation process and the need for a wet etch, which affects the dimensional control of etch windows.

What is desired is a method for restoring a high quality silicon surface after formation of a seed hole and prior to the use of selective epitaxial growth techniques which overcomes the disadvantages of currently used techniques.

SUMMARY OF THE INVENTION

The present invention is directed to a method of producing a high quality silicon surface prior to carrying out a selective epitaxial growth of silicon process when forming active device regions on a substrate. The process flow of the present invention eliminates the need for the sacrificial oxidation layer typically used in such processes.

After the etching of a seed hole through an isolation oxide layer using a reactive ion etch (for example, a $CHF_3/C_2F_6$ etch), a short, low power $C_2F_6$ etch is performed. The present invention provides a simple and cost-effective way to eliminate reactive ion etch damage prior to SEG growth because the dry $C_2F_6$ etch can be done in the same etch reactor in which the seed hole oxide etch is performed. In addition, the re-oxidation (sacrificial oxide) step typically used is eliminated, reducing the number of process steps.

Further objects and advantages of the present invention will become apparent from the following detailed description and accompanying drawings.

DETAILED DESCRIPTION OF THE PREFERRED EMBODIMENT

In order to evaluate the results of practicing the method of the present invention and to compare those results with other methods used for producing active devices using SEG, substrate wafers to which the method of the invention was applied were compared with two other process flows: wafers in which the seed hole was wet etched, and wafers where a reoxidation step was performed. N-type SEG silicon was grown in P-type <100> substrates in all tested wafers and the resulting diode formed at the substrate/SEG interface was used to evaluate the quality of the interface, and hence the quality of the silicon surface prior to the SEG process. As will be discussed, analysis indicated that the diodes formed on wafers with the $C_2F_6$ etch of the present invention and no sacrificial oxidation step exhibited ideality factors which were the same (within acceptable tolerances) as the diodes resulting from the wet etched seed hole and the re-oxidized seed hole processes.

Diode Fabrication

Figure 1A:
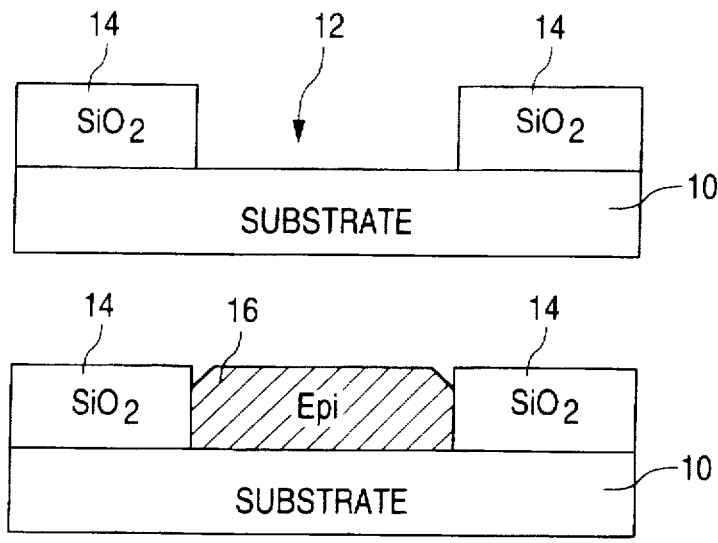
FIGS. 1A and 1B show examples of the two basic selective epitaxy processes.
Figure 1B:
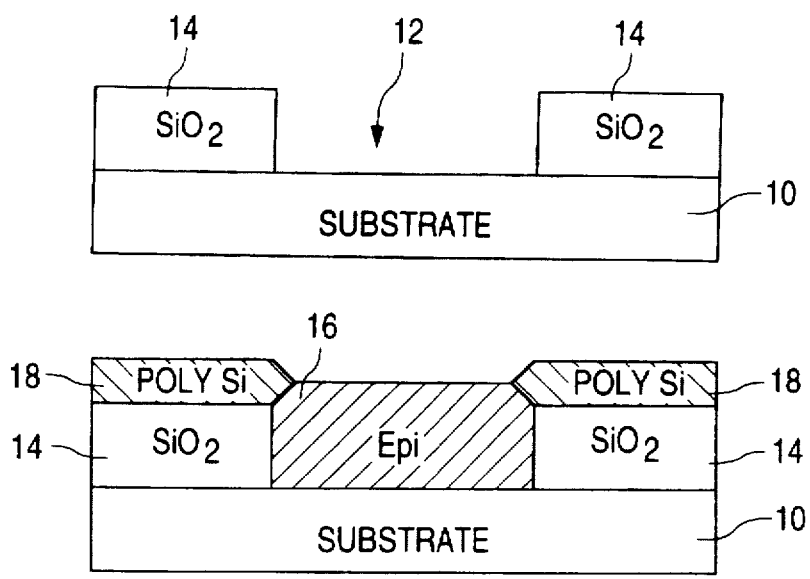
Figure 2:
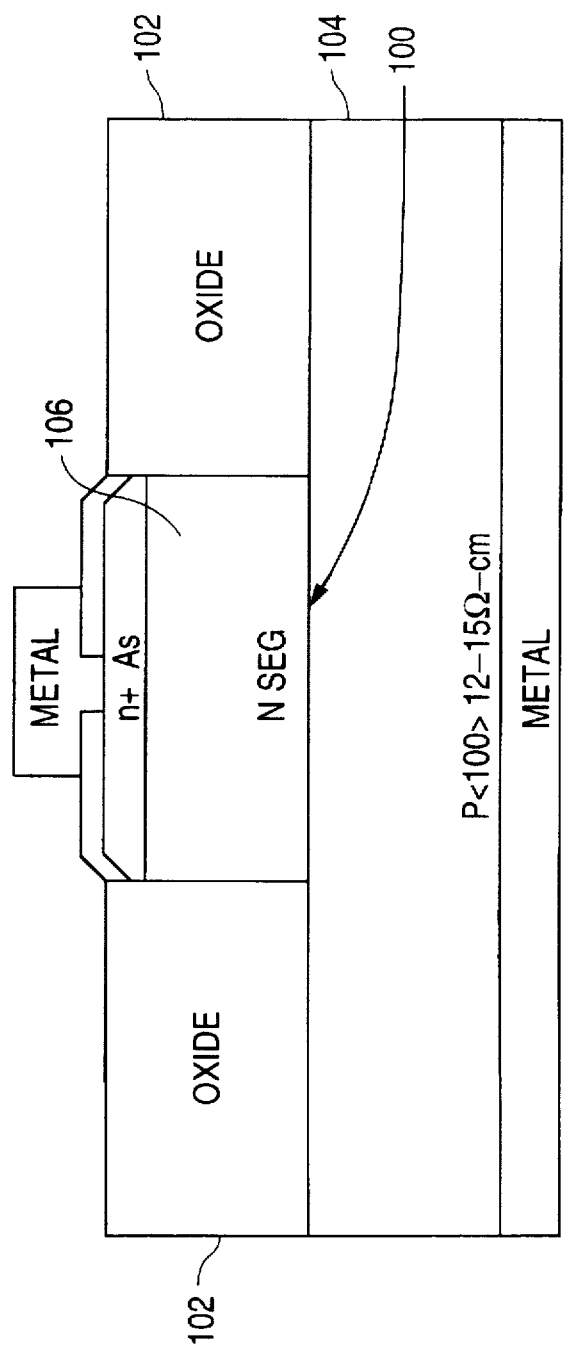
FIG. 2 is a cross-sectional view of the diodes fabricated by means of the processes used to compare the method of the present invention with other techniques for preparing a substrate surface prior to a SEG process.

FIG. 2 is a cross-sectional view of the diodes fabricated by means of the processes used to compare the method of the present invention with other techniques for preparing a substrate surface prior to a SEG process. As noted, an NP junction diode formed at the substrate/SEG silicon boundary 100 was used to characterize the silicon surface (and hence the results of the various surface treatments) prior to a selective epitaxial growth step. In all cases, a one micron (1.0 µm) thick layer of thermal oxide 102 was grown on P <100> substrates 104 having a resistivity of 12–15 Ω-cm. Various processes were then used to open and prepare the seed hole prior to selective epitaxial growth of silicon. The processes used were:

Process 1

This process was used as the control sample. The 1.0 µm of thermal oxide was wet etched using BHF solution with a photoresist mask. The photoresist mask was then stripped using piranha (1:1 $H_2O_2$:$H_2SO_4$) clean.

Process 2

The 1.0 µm of thermal oxide was etched using a $CHF_3$/$C_2F_6$ (114 sccm:38 sccm) reactive ion etch in a LAM 384 Triode etcher (manufactured by Lam Research, Fremont, Calif.) at a pressure of 130 mT and a power of 450 watts with the bias applied to the wafer electrode. The etch produced vertical sidewalls and had a selectivity of 8:1 (oxide:silicon). The etch process had an automatic endpoint with a 20% overetch. This insured the complete etching of the oxide to expose the silicon surface across the entire wafer. The photoresist mask was stripped using piranha (1:1 $H_2O_2$:$H_2SO_4$) clean.

Process 3

In this process, the oxide was etched in the same manner as in process 2. After the oxide was etched, the photoresist mask was stripped using piranha (1:1 $H_2O_2$:$H_2SO_4$) clean. The wafer was then oxidized at 1050° C. in dry $O_2$ to produce a 500 Å thick sacrificial layer of oxide. This oxide was then wet etched using a BHF solution prior to the selective epitaxial growth step.

Process 4

After the masking oxide was etched as described in process 2 in the LAM 384T etcher, the process step of the present invention was added to the etch process. A 10 second etch using $C_2F_6$ plasma at a pressure of 130 mT and a power of 150 watts was conducted in the same etcher as used for the oxide etch. The purpose of this etch was to remove the reactive ion etch damage and residual polymers formed during the oxide etch by removing 50–100 Å of the silicon surface. The photoresist mask was then removed using a piranha clean followed by a short BHF dip. As is well known, use of a $C_2F_6$ plasma etch does not produce the silicon damage or residual polymers which result from the oxide etch step.

After completion of the processes described, all of the wafers were cleaned in a megasonic cleaner in a $H_2O_2$:$NH_4OH$ solution. The wafers were then placed in an Applied Materials 7800 barrel reactor. A two minute $H_2$ bake and a 30 second HCL etch, both at 980° C., were used prior to the SEG process. SEG silicon 106 was then grown from the silicon seed holes at a temperature of 980° C. and a pressure of 40 torr at a growth rate of 0.17 µm/min, to result in 1 µm of material growth. The SEG was then arsenic doped at a concentration of $7\times10^{15}$ cm$^{-3}$. After the SEG step, arsenic was implanted in the n-type silicon at an energy of 60 keV and a dose of $5\times10^{15}$ cm$^{-3}$. Low temperature oxide (LTO) was deposited and densified at 1050° C. for 15 minutes, which also activated the implant. Contacts were then opened and the wafers were metalized.

Figure 3:
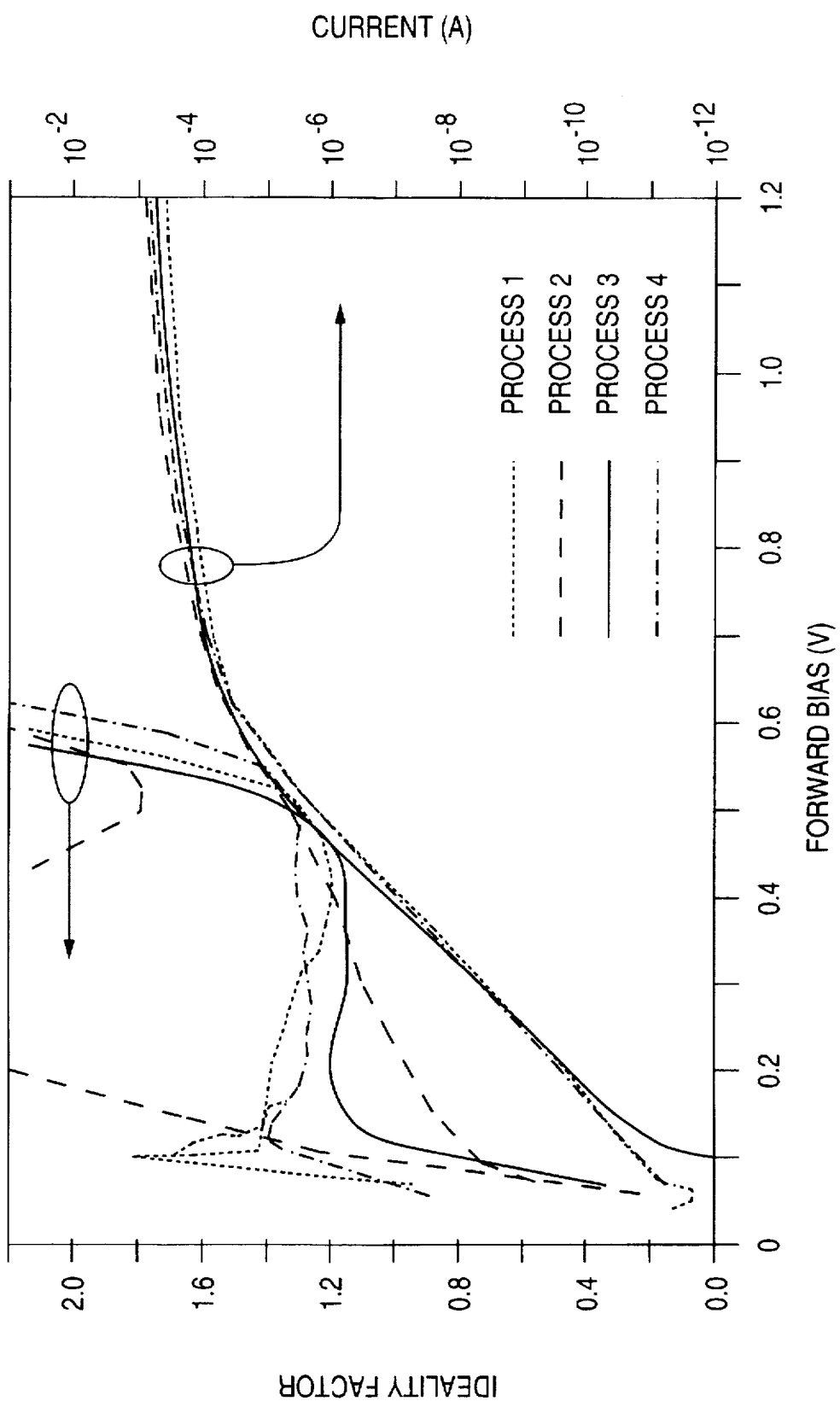
FIG. 3 is a graph showing the forward biased I-V plots and ideality factors for the diodes fabricated by the four processes used to compare the method of the present invention with other techniques for preparing a substrate surface prior to a SEG process.

FIG. 3 is a graph showing the forward biased I-V plots and ideality factors for the diodes fabricated by the four processes used to compare the method of the present invention with other techniques for preparing a substrate surface prior to a SEG process. As is well known, the ideality factor is a parameter which indicates the material quality and junction quality of a diode. By definition, the ideality factor, η, is obtained from the slope of the diode current from a semi-log plot of the current as a function of bias voltage. For an ideal diode, η=1. The higher the value of η, the worse the quality of the diode. The diodes fabricated in this case were circular with an area of about 5000 µm$^{-2}$. Table 1 below lists the measured device parameters for the processes.

TABLE 1

| Sample Type | Ideality Factor | Leakage @ -10 V | BV @ 10 µA |
|---|---|---|---|
| Process 1 | 1.28 | 0.31 pA/µm$^2$ | 92 V |
| Process 2 | 1.79 | 2.2 pA/µm$^2$ | 81 V |
| Process 3 | 1.30 | 0.62 pA/µm$^2$ | 86 V |
| Process 4 | 1.22 | 0.31 pA/µm$^2$ | 81 V |

The control diode of process 1 exhibited a very smooth surface morphology after the SEG and the lowest ideality factor of 1.28. The fact that the ideality factor is higher than 1.0 can be explained by the sidewall defects generated as a result of thermal stress during the cool-down period after the SEG growth.

The dry etched diode of process 2 resulted in a rough surface after SEG when observed through Nomarski microscope and an ideality factor of 1.79, indicating excessive recombination in the forward biased depletion region due to surface damage. The excess current can be attributed to the presence of defects at the substrate-SEG interface resulting from the reactive ion etch of the oxide. SUPREM-3 simulations show that the diode junction is about 400 Å below the SEG/substrate interface due to the diffusion of arsenic from the SEG into the substrate. The forward biased depletion width at 0.5V can be calculated to be about 600 Å. Any defects at the SEG/substrate interface will be manifested in the diode I–V characteristics of FIG. 3. It should be noted that an HCl etch prior to SEG was not effective, most probably because the residual polymer does not get etched.

When the silicon surface was oxidized (process 3), the damaged region was consumed and the resulting SEG diode quality was restored, as indicated by an ideality factor of 1.3. It is noted that the diode fabricated by means of the method of the present invention (process 4) possessed electrical characteristics nearly the same as that of the diodes formed using processes 1 and 3.

The $C_2F_6$ etch used in accordance with the present invention etched the residual polymer from the oxide etch and also removed the damaged silicon. Due to the relatively low power of the $C_2F_6$ etch (as compared to applications in which a high power $C_2F_6$ etch is used to etch oxide), this was accomplished without producing additional damage to the silicon substrate. Since the $C_2F_6$ etch was performed in the same reactor as the oxide, the process was simple and cost-effective. The reverse leakage currents showed a trend similar to the ideality factors. Except for the fact that the process 2 diode exhibited soft breakdown, the breakdown voltages measured at 10 µA were relatively independent of the surface treatment.

In accordance with the present invention, a simple and manufacturable process for producing a high quality silicon surface prior to selective epitaxial growth (SEG) has been presented. A low power $C_2F_6$ etch is used after the oxide etch used to open the seed hole and form the trench for deposition of the SEG silicon. The $C_2F_6$ etch is performed in the same reactor as the oxide etch and acts to remove residual polymers and correct for reactive ion etch damage resulting from the oxide etch. N-type SEG was then grown on a P-type substrate. The diodes formed at the SEG/substrate interface were used to evaluate the interface quality and hence the surface preparation prior to the SEG step. It was shown that the diodes fabricated with the in-situ $C_2F_6$ etch indicated an excellent surface quality, thus eliminating the need for the conventional sacrificial oxidation step. This simplifies the process flow and eliminates the disadvantages associated with the sacrificial oxide step.

Although the present invention has been described with reference to a $CHF_3/C_2F_6$ oxide etch which precedes the low power $C_2F_6$ etch, it is noted that the invention can also be used following other oxide etch chemistries. These other chemistries include, for example, $CF_4$ and $CF_4/O_2$ oxide etches. In addition, while the oxide etch is typically a reaction ion etch process, the low power $C_2F_6$ etch of the present invention is not so limited, and may be for example, a reactive ion etch or plasma etch.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A method of manufacturing a semiconductor device, comprising:
   forming a layer of isolation oxide on a silicon substrate;
   etching an opening down to the substrate in the isolation oxide layer using a reactive ion etch process;
   exposing the opening in the isolation oxide layer to a second dry etch process immediately following the first dry etch process, thereby removing polymers formed on the substrate and damage to the substrate resulting from the reactive ion etch;
   growing silicon in the opening using a selective epitaxial growth process; and
   processing the silicon grown by the selective epitaxial growth process to produce an active device region for the semiconductor device.

2. A method of manufacturing a semiconductor device, comprising:
   forming a layer of isolation oxide on a silicon substrate;
   etching an opening down to the substrate in the isolation oxide layer using a first reactive ion etch process;
   exposing the opening in the isolation oxide layer to a second reactive-ion etch process, thereby removing polymers formed on the substrate and damage to the substrate resulting from the first reactive ion etch;
   growing silicon in the opening using a selective epitaxial growth process; and
   processing the silicon grown by the selective epitaxial growth process to produce an active device region for the semiconductor device.

3. A method of manufacturing a semiconductor device, comprising:
   forming a layer of isolation oxide on a silicon substrate;
   etching an opening down to the substrate in the isolation oxide layer using a reactive ion etch process;
   exposing the opening in the isolation oxide layer to a plasma etch process, thereby removing polymers formed on the substrate and damage to the substrate resulting from the first reactive ion etch;
   growing silicon in the opening using a selective epitaxial growth process; and
   processing the silicon grown by the selective epitaxial growth process to produce an active device region for the semiconductor device.

4. The method of manufacturing a semiconductor device of claim 2, wherein the second reactive ion etch is a $C_2F_6$ reactive ion etch.

5. The method of manufacturing a semiconductor device of claim 4, wherein the second reactive ion etch is performed at a pressure of 130 mT and a power of 150 watts.

6. A method of growing high quality silicon for use in forming an active device region on a substrate, comprising:
   opening a seed hole in a layer of oxide deposited on the substrate;
   exposing the seed hole in the oxide layer to a dry etch process immediately following the opening of the seed hole, thereby removing the polymers formed on the substrate and damage to the substrate which occurs during the opening of the seed hole; and
   growing a high quality silicon body in the seed hole using a selective epitaxial growth process.

7. A method of growing high quality silicon for use in forming an active device region on a substrate, comprising:
   opening a seed hole in a layer of oxide deposited on the substrate;
   exposing the seed hole in the oxide layer to a reactive ion etch process, thereby removing the polymers formed on the substrate and damage to the substrate which occurs during the opening of the seed hole; and
   growing a high quality silicon body in the seed hole using a selective epitaxial growth process.

8. A method of growing high quality silicon for use in forming an active device region on a substrate, comprising:
   opening a seed hole in a layer of oxide deposited on the substrate;
   exposing the seed hole in the oxide layer to a plasma etch process, thereby removing the polymers formed on the substrate and damage to the substrate which occurs during the opening of the seed hole; and
   growing a high quality silicon body in the seed hole using a selective epitaxial growth process.

9. The method of growing high quality silicon of claim 7, wherein the reactive ion etch process is a $C_2F_6$ reactive ion etch.

10. The method of growing high quality silicon of claim 9, wherein the $C_2F_6$ reactive ion etch is performed at a pressure of 130 mT and a power of 150 watts.

11. The method of growing high quality silicon of claim 6, wherein the seed hole is opened by a reactive ion etch process.

12. A method of treating a seed hole formed in an oxide layer overlying a silicon substrate to remove silicon damage and polymers formed during the formation of the seed hole prior to a selective epitaxial growth process, comprising exposing the seed hole in the oxide layer to a $C_2F_6$ etch process.

13. The method of claim 12, wherein the $C_2F_6$ etch is a reactive ion etch process.

14. The method of claim 13, wherein the $C_2F_6$ reactive ion etch process is performed at a pressure of 130 mT and a power of 150 watts.

* * * * *